(12) United States Patent
Stella et al.

(10) Patent No.: US 11,658,108 B2
(45) Date of Patent: May 23, 2023

(54) POWER SEMICONDUCTOR DEVICE WITH A DOUBLE ISLAND SURFACE MOUNT PACKAGE

(71) Applicant: STMicroelectronics S.r.l., Agrate Brianza (IT)

(72) Inventors: Cristiano Gianluca Stella, San Gregorio di Catania (IT); Agatino Minotti, Mascalucia (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 180 days.

(21) Appl. No.: 17/142,738

(22) Filed: Jan. 6, 2021

(65) Prior Publication Data

US 2021/0159161 A1    May 27, 2021

Related U.S. Application Data

(63) Continuation of application No. 16/385,928, filed on Apr. 16, 2019, now Pat. No. 10,910,302.

(30) Foreign Application Priority Data

Apr. 23, 2018 (IT) .................. 102018000004782

(51) Int. Cl.
*H01L 23/498* (2006.01)
*H01L 23/373* (2006.01)

(52) U.S. Cl.
CPC .... *H01L 23/49844* (2013.01); *H01L 23/3735* (2013.01); *H01L 23/49822* (2013.01)

(58) Field of Classification Search
CPC .......... H01L 23/3735; H01L 23/49822; H01L 2224/40139; H01L 2224/40137;
(Continued)

(56) References Cited

U.S. PATENT DOCUMENTS

2009/0079006 A1    3/2009  Tanaka et al.
2013/0015468 A1*   1/2013  Kikuchi ................ H01L 23/36
                                                                257/77
(Continued)

FOREIGN PATENT DOCUMENTS

EP          2 804 212 A1    11/2014
WO       2017/157486 A1     9/2017

*Primary Examiner* — Julio J Maldonado
*Assistant Examiner* — Stanetta D Isaac
(74) *Attorney, Agent, or Firm* — Seed IP Law Group LLP

(57) ABSTRACT

A power semiconductor device including a first and second die, each including a plurality of conductive contact regions and a passivation region including a number of projecting dielectric regions and a number of windows. Adjacent windows are separated by a corresponding projecting dielectric region with each conductive contact region arranged within a corresponding window. A package of the surface mount type houses the first and second dice. The package includes a first bottom insulation multilayer and a second bottom insulation multilayer carrying, respectively, the first and second dice. A covering metal layer is arranged on top of the first and second dice and includes projecting metal regions extending into the windows to couple electrically with corresponding conductive contact regions. The covering metal layer moreover forms a number of cavities, which are interposed between the projecting metal regions so as to overlie corresponding projecting dielectric regions.

20 Claims, 5 Drawing Sheets

(58) Field of Classification Search
CPC ........... H01L 2224/40132; H01L 24/24; H01L 24/26; H01L 24/29; H01L 24/34; H01L 24/37; H01L 24/40; H01L 24/74; H01L 24/741; H01L 24/744; H01L 24/77; H01L 24/84

See application file for complete search history.

(56) References Cited

U.S. PATENT DOCUMENTS

2013/0161801 A1   6/2013   Otremba et al.
2015/0076676 A1*   3/2015   Lu ........................... H01L 24/97
                                                 257/676

* cited by examiner

POWER SEMICONDUCTOR DEVICE WITH A DOUBLE ISLAND SURFACE MOUNT PACKAGE

BACKGROUND

Technical Field

The present disclosure relates to a power semiconductor device having a package of the surface mount type and including a pair of islands.

Description of the Related Art

As is known, semiconductor devices are widely used in numerous fields. For instance, in the field of power conversion, semiconductor devices are widely used, which, in operation, are subject to high-voltage or very-high-voltage biasing (i.e., with values of up to 1000-2000 V) and are traversed by currents that may switch rapidly.

There are hence required particular solutions for production of the corresponding packages so as to guarantee the required electrical insulation and an adequate distance of separation between the leads that are connected to the terminals of the device, as well as to ensure an adequate heat dissipation outwards.

In general, it is common to refer to power devices to indicate semiconductor devices capable of withstanding the aforementioned biasing voltages and currents.

Power devices include, for example, the so-called power MOSFETs, each of which is provided in a die of semiconductor material (typically silicon), which has a first main surface (rear surface) that carries a drain contact pad, and a second main surface (front surface), opposite to the first main surface, which carries contact pads, in particular source and gate pads.

The die is fixed to a conductive support referred to as "leadframe", provided with leads for external connection of the terminals of the power MOSFET. In particular, the die is generally fixed to the leadframe by bonding the drain pad to a supporting portion of the leadframe, which also has a function of heat dissipation. Leads are coupled to the gate and source pads by bonding wires or clips. The ensemble consisting of the die and the leadframe is packaged in a mass of resin or other insulating packaging material.

Traditional packages for power MOSFETs are generally arranged vertically and comprise pins, which form corresponding leads and project downwards from a single bottom side of the package structure (which has a generically parallelepipedal shape), for electrical coupling to a printed-circuit board (PCB). An appropriate heat dissipater, typically a metal plate, is coupled to the package structure, which is also arranged vertically with respect to the printed-circuit board.

Power MOSFET devices are widely used, for example, in the field of the so-called switch-mode power supplies (SMPSs) with power-factor correction (PFC) of a bridgeless type. In particular, power MOSFET devices are used for providing so-called bidirectional AC switches, which enable interruption, in an electrically controlled way, of alternating currents. In this connection, typically an AC switch comprises a pair of power MOSFET devices, connected in back-to-back mode, i.e., by connecting together the respective source terminals. Moreover, the two power MOSFET devices that form the AC switch are of the type previously described; hence, they are of a discrete type and each of them has a respective package of a vertical type, with the corresponding vertical pins. Unfortunately, these packages, albeit guaranteeing an optimal dissipation of heat and high levels of electrical insulation, are particularly cumbersome and do not enable integration of the two power MOSFET devices together.

BRIEF SUMMARY

Embodiments of the present disclosure provide a power semiconductor device that will overcome at least in part the drawbacks of the prior art.

According to one embodiment of the present disclosure, a power semiconductor device includes a first die and a second die, each of which comprises a plurality of conductive contact regions and a passivation region, which includes a number of projecting dielectric regions and a number of windows. Adjacent windows are separated by a corresponding projecting dielectric region, each conductive contact region being arranged within a corresponding window. The device includes a package of the surface mount type, housing the first and second dies. The package includes a first bottom insulation multilayer and a second bottom insulation multilayer, which carry, respectively, the first and second dice and each include a respective top metal layer, a respective bottom metal layer and a respective intermediate insulating layer, interposed between the corresponding top metal layer and the corresponding bottom metal layer. A covering metal layer is arranged on top of the first and second dice and comprises projecting metal regions, which extend into the windows so as to couple electrically with corresponding conductive contact regions. The covering metal layer moreover forms a number of cavities, interposed between the projecting metal regions so as to overlie corresponding projecting dielectric regions.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein.

DETAILED DESCRIPTION

Figure 1:
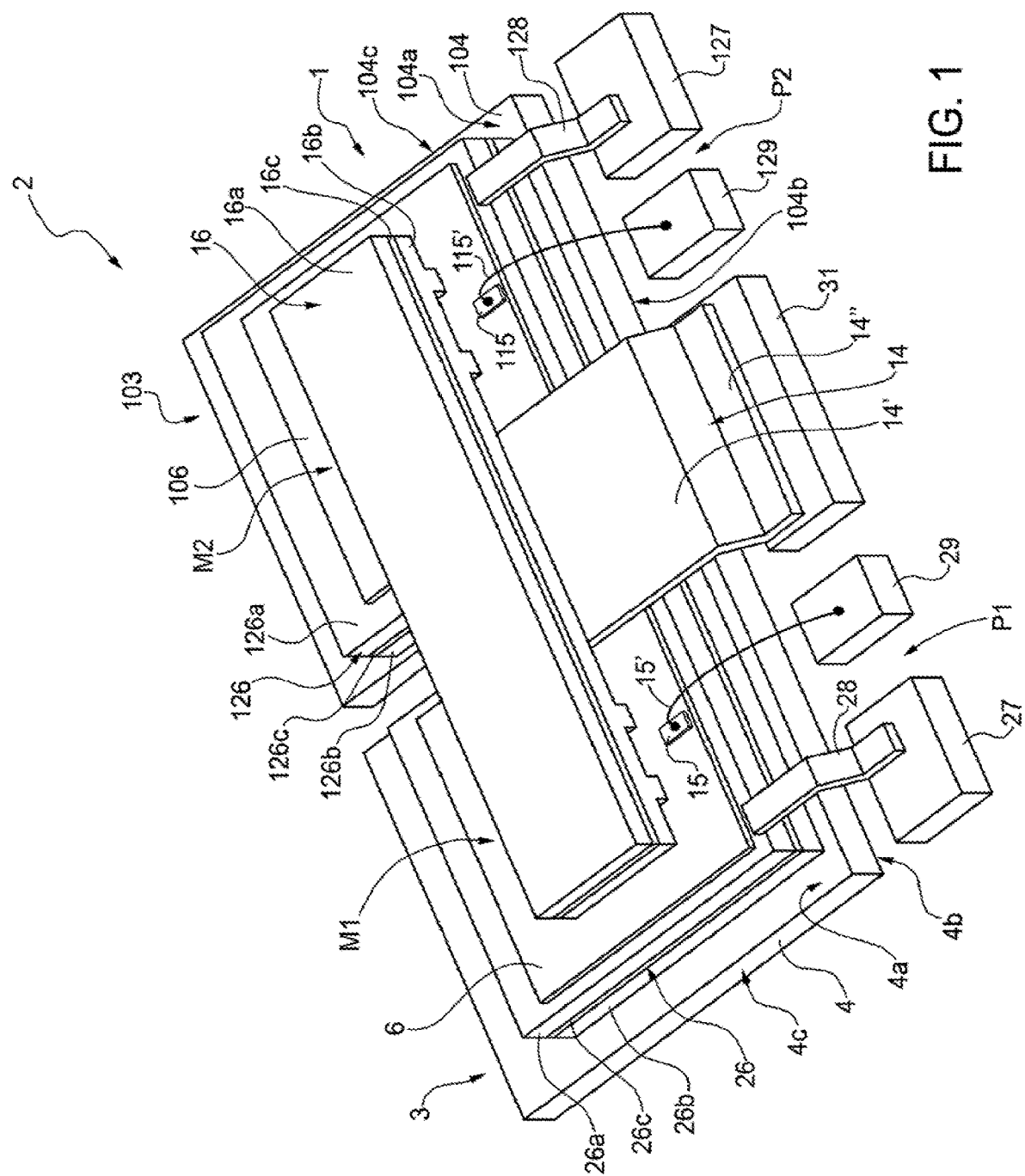
FIG. 1 is a partially simplified schematic perspective view, with portions removed, of an embodiment of the present semiconductor device.

FIG. 1 shows a package 1 for a semiconductor device 2, in particular a bidirectional AC switch. As will be highlighted hereinafter, the package 1 is of the double island surface mount type.

In detail, the package 1 comprises a package coating 5 (illustrated in FIG. 2, but not in FIG. 1), made of insulating material (for example, an epoxy resin), and a first portion P1 and a second portion P2. Without this implying any loss of generality, the first and second portions P1, P2 are the same as one another and are arranged in a symmetrical way within the semiconductor device 2, as on the other hand also are the first and second dice 6, 106. In what follows, for brevity, only the first portion P1 of the package 1 is hence described. Moreover, the components of the second portion P2 are designated by the same reference numbers as the components of the first portion P1, increased by 100.

In detail, the first portion P1 comprises a support 4 of a leadframe 3, formed by a metal plate (for example, made of copper and with a parallelepipedal shape) and having a top surface 4a and a bottom surface 4b. The support 4, in itself known, is also referred to as "island" or "die pad."

The bottom surface 4b of the support 4 forms an exposed bottom surface 1b of the package 1 (illustrated in FIG. 2), which can itself function as heat dissipater or be coupled (in a way not illustrated herein) to an external heat dissipater so as to increase the capacity of heat dissipation towards the outside.

The package coating 5, inter alia, englobes and coats at the top the support 4 (leaving the bottom surface 4b thereof exposed, as mentioned previously), and a lateral surface 4c.

The first portion P1 of the package 1 further comprises a bottom insulation multilayer 26, arranged on top of the support 4. In particular, the bottom insulation multilayer 26 is a multilayer of the DBC (Direct Bonded Copper) type, and is hence formed by a respective top metal layer 26a and a respective bottom metal layer 26b, both made of copper, as well as by a respective intermediate layer 26c made of ceramic material, for example alumina ($Al_2O_3$), or alternatively aluminum nitride (AlN) or beryllium oxide (BeO). The top metal layer 26a, the bottom metal layer 26b, and the intermediate layer 26c are arranged stacked on one another and are coupled together by means of direct eutectic bonding at high temperature; the intermediate layer 26c electrically insulates the top and bottom metal layers 26a, 26b.

Figure 2:
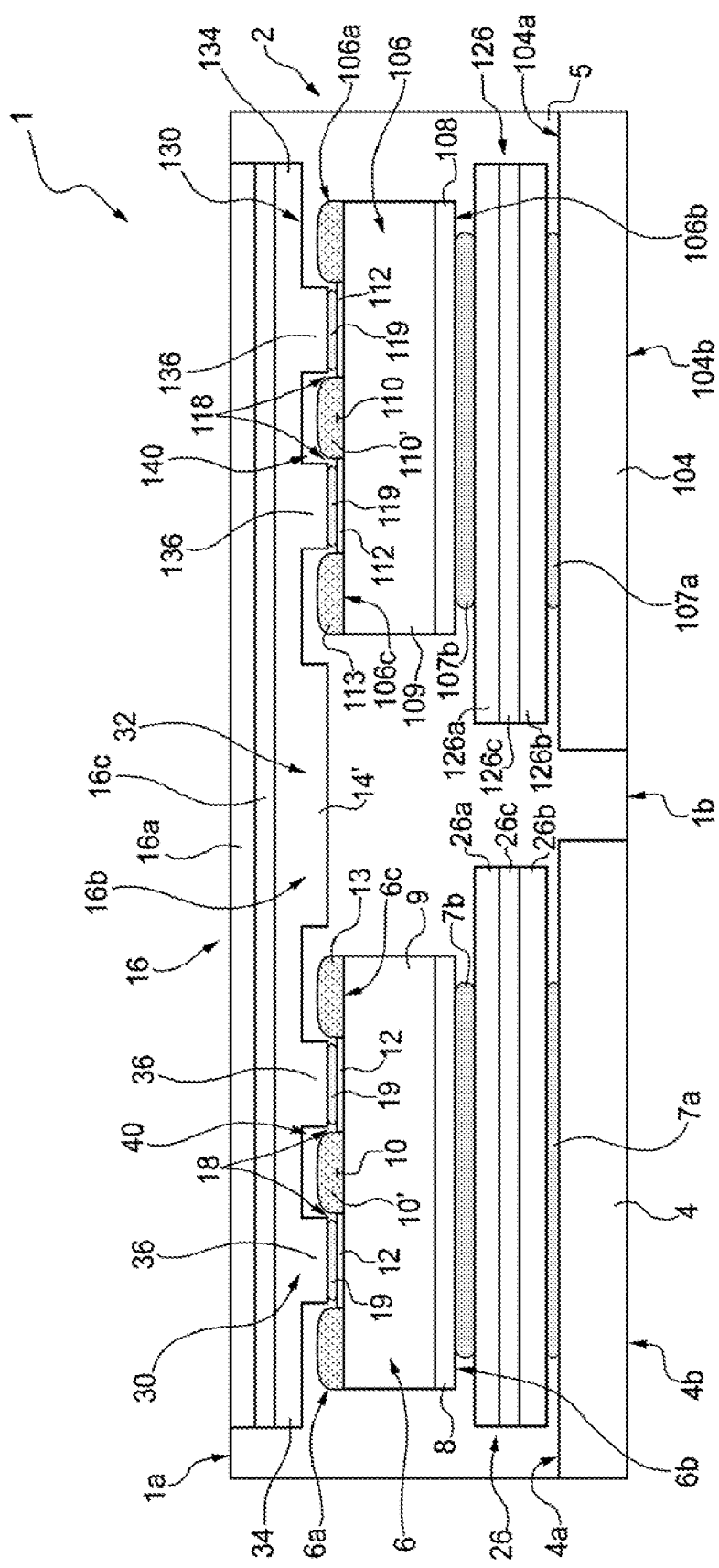
FIG. 2 is a schematic cross-sectional view of the device illustrated in FIG. 1.

The bottom metal layer 26b is coupled to the top surface 4a of the support 4, by means of a first layer of solder paste 7a (illustrated in FIG. 2).

The semiconductor device 2 further comprises a first die 6 and a second die 106, formed inside which are a first power MOSFET M1 and a second power MOSFET M2, respectively. Without this implying any loss of generality, the first and second dice 6, 106 are the same as one another and are arranged in a symmetrical way within the semiconductor device 2. In what follows, for brevity, only the first die 6 is hence described. Moreover, the components of the second die 106 are designated by the same reference numbers as the components of the first die 6, increased by 100. In addition, the first and second dice 6, 106 are, respectively, coupled to the first and second portions P1, P2 of the package 1, in one and the same way. Hence, in what follows just bonding of the first die 6 to the first portion P1 of the package 1 is described. In addition, it may be noted how in FIG. 1 the first and second dice 6, 106 are illustrated qualitatively, as likewise the corresponding details as regards coupling with an element defined hereinafter as "top insulation multilayer 16", described in what follows; for these details, as well as for the details regarding the first and second dice 6, 106, the reader is hence referred to the description of FIG. 2.

In detail, the first die 6 is arranged on the bottom insulation multilayer 26 of the first portion P1 of the package 1.

In greater detail, the first die 6 has a front surface 6a, a rear surface 6b, and an intermediate surface 6c. Moreover, the first die 6 comprises a body 9 made of semiconductor material, for example silicon, integrated in which are, in a way in itself known and not illustrated in detail herein, a plurality of elementary units (or cells) of the first power MOSFET M1, arranged in stripes and having, for example, a vertical, columnar, structure, each cell being provided with a respective gate region and a respective source region. The semiconductor body 9 is delimited at the top by the aforementioned intermediate surface 6c and that forms gate and source regions of the first power MOSFET M1.

In addition, the first die 6 comprises a drain metallization 8, which is arranged underneath the semiconductor body 9, in direct contact therewith, and forms the rear surface 6b of the first die 6. The drain metallization 8 forms a drain pad of the first power MOSFET M1. In addition, the drain metallization 8, and hence the rear surface 6b of the first die 6, is coupled to the top metal layer 26a of the bottom insulation multilayer 26 by interposition of a second layer of solder paste 7b. The drain metallization 8 is hence electrically and thermally connected to the top metal layer 26a of the insulation multilayer 26. Moreover, the drain metallization 8 of the first power MOSFET M1 is electrically insulated from the support 4.

The first die 6 further comprises a passivation region 13, which extends on the semiconductor body 9 and forms the aforementioned top surface 6a. In this connection, it should be noted how, as mentioned previously, in FIG. 1 the first die 6 is illustrated as a whole, i.e., without illustrating, inter alia, the semiconductor body 9, the passivation region 13, and the drain metallization 8.

Figure 3:
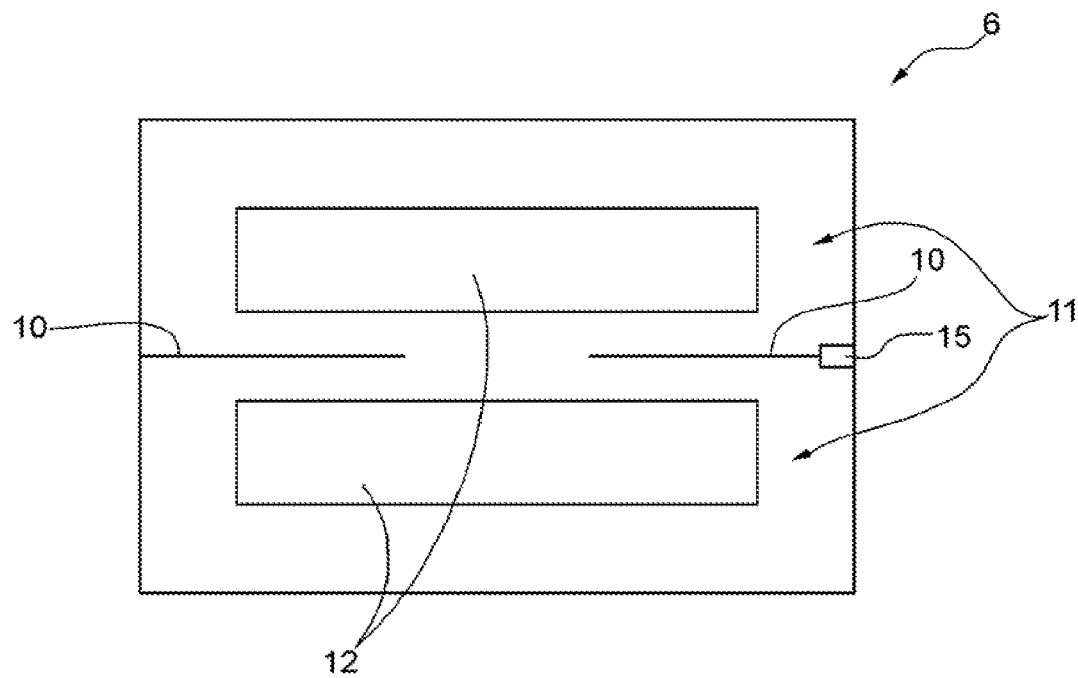
FIG. 3 is a schematic top plan view, with portions removed, of a die of the device illustrated in FIGS. 1 and 2.

As shown in greater detail in FIG. 3 (where, however, the passivation region 13 is not illustrated, for greater clarity), the first die 6 comprises a number of gate-metallization lines 10 (the so-called "gate fingers"), which enable biasing (in a way not illustrated, but in itself known) of the gate regions of the cells of the first power MOSFET M1. In this connection, in the embodiment illustrated in FIG. 3 just one gate-metallization line 10 is present, without this implying any loss of generality.

The gate-metallization lines 10 extend underneath the passivation region 13 and are parallel to one another. In addition, the gate-metallization lines 10 may be continuous or, as in the example illustrated, have interruptions along their longitudinal extension. In addition, the gate-metallization lines 10 delimit, in top plan view, portions 11 (illustrated only in FIG. 3) of the passivation region 13, which are referred to in what follows as "top passivation areas 11".

Figure 4:
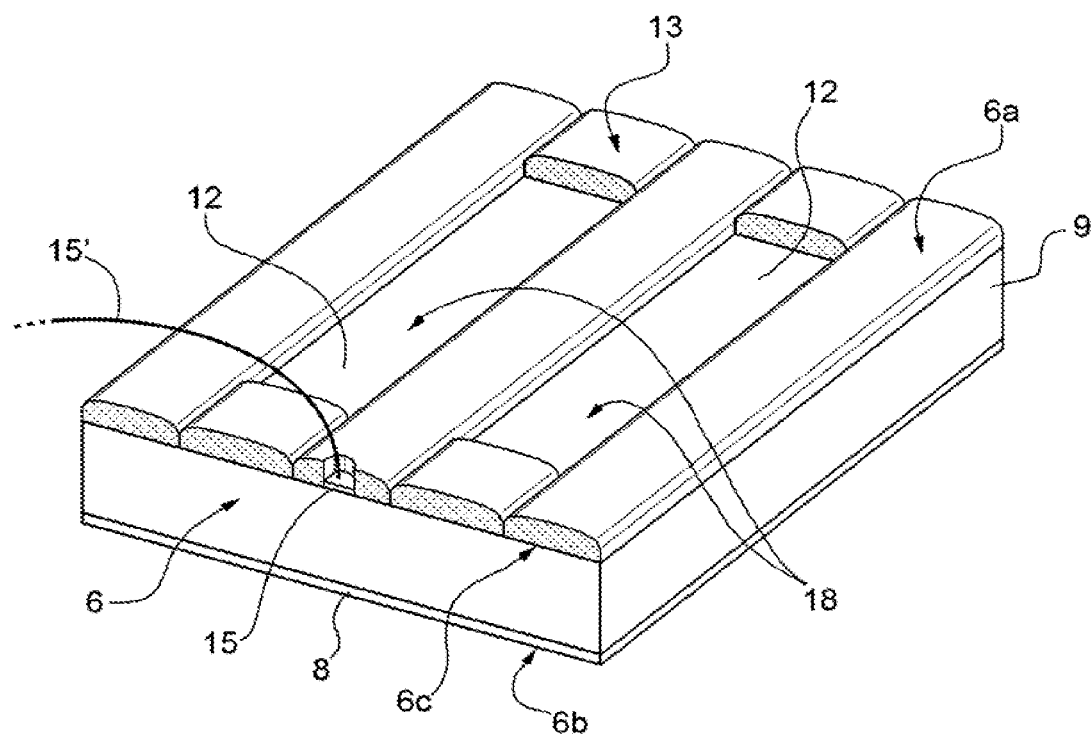
FIG. 4 is a schematic perspective view of the die illustrated in FIG. 3.

As illustrated in FIG. 4, formed within the top passivation areas 11 are corresponding windows 18 (illustrated in FIG. 4), which extend within the passivation region 13, starting from the top surface 6a, for a depth such as to not penetrate into the semiconductor body 9. In particular, each window 18 is delimited laterally by two portions of the corresponding top passivation area 11.

As may be seen in FIGS. 2-4, the first die 6 further comprises source contact regions 12 (also referred to as source pads), which are made of conductive material (for example, a metal), are in electrical contact with the source regions of the cells of the first power MOSFET M1 and are insulated from the aforesaid gate-metallization lines 10. In addition, each source contact region 12 delimits a corresponding window 18 at the bottom.

In the example illustrated, the source contact regions 12 are rectangular in top plan view and moreover have dimensions that are the same as one another. In particular, present in the first die 6 are two top passivation areas 11, present within which are two windows 18, arranged inside which are corresponding source contact regions 12. However, as mentioned previously, the distribution and number of the gate-metallization lines 10, of the top passivation areas 11, and of the source contact regions 12 may vary according to the characteristics and requirements of the power semiconductor device 2. Moreover, assuming, in general, a succession of any number of top passivation areas 11, the top initial and final passivation areas of the succession are delimited only on a respective side (in particular, the one facing the other top passivation areas) by a respective gate-metallization line 10. Consequently, considering each of the corresponding two windows 18, one of the two portions of the corresponding top passivation area 11 that delimit them (in particular, the portion facing outwards) does not contain any gate-metallization line.

As mentioned previously, the aforesaid source contact regions 12 are arranged within the top passivation areas 11, approximately at one and the same height with respect to the gate-metallization lines 10. Moreover, the source contact regions 12 delimit the corresponding windows 18 at the bottom.

Once again with reference to the gate-metallization lines 10, each of them is overlaid by a corresponding portion 10' of the passivation region 13, referred to in what follows as "corresponding main passivation portion 10'". In particular, each gate-metallization line 10 is coated with a corresponding main passivation portion 10'.

The first die 6 further comprises one or more gate pads 15, visible only in FIG. 1 (where just one is illustrated, arranged approximately, and qualitatively, on the first die 6) and in FIG. 4. In particular, with reference to FIG. 4, for simplicity of representation, this shows the gate pad 15 as being arranged in contact with the semiconductor body 9, even though in actual fact the gate pad 15 is arranged at a (short) distance from the latter. Each gate pad 15 is electrically coupled to a corresponding gate-metallization line 10. In addition, the passivation region 13 leaves the gate pads 15 exposed. Without this implying any loss of generality, in the example illustrated in FIGS. 1-4, the first die 6 comprises just one gate pad 15.

Once again with reference to the first portion P1 of the package 1, it further comprises a drain lead 27 and a gate lead 29, which have, for example, the shape of parallelepipeds, are made of the same metal material as the one of which the support 4 is made and are physically separated from one another, as well as from the support 4. The drain lead 27 is connected to the top metal layer 26a of the insulation multilayer 26, and in particular to a portion of the top metal layer 26a not overlaid by the first die 6, by means of a so-called clip 28 (illustrated in FIG. 1) made of conductive material (for example, copper), referred to in what follows as "drain clip 28". In a way in itself known, the drain clip 28 is connected at its ends to the aforementioned portion of the top metal layer 26a and to the drain lead 27, by means of corresponding areas of solder paste (not illustrated).

The gate pad 15 of the first die 6 is connected to the gate lead 29 of the first portion P1 of the package 1 by means of a conductive wire 15', i.e., by means of wire bonding.

Figure 5:
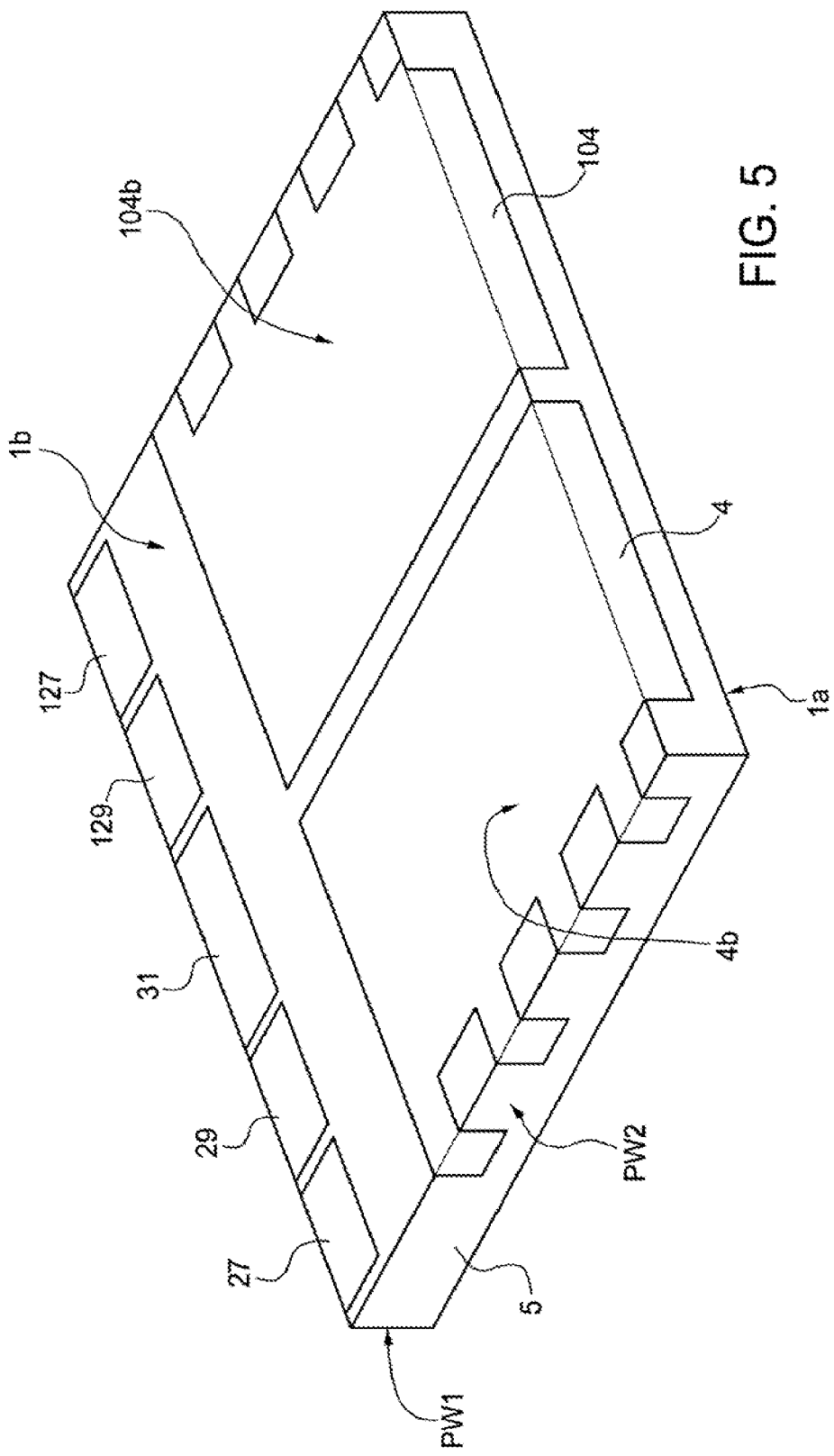
FIG. 5 is a schematic perspective view of a further embodiment of the present device.

Once again with reference to the first portion P1 of the package 1, as may be seen in FIG. 5, the corresponding drain leads 27 and gate leads 29 are exposed laterally and underneath; i.e., they are not coated with the coating 5. In other words, assuming that the coating 5 has an envelope shaped, for example, like a parallelepiped, the bottom and top bases of which are formed by the bottom surface 1b and by a top surface 1a, the drain leads 27 and gate leads 29 form a first lateral surface PW1 of said envelope, in addition to forming the bottom surface 1b. On the other hand, also the part of the support 4 is laterally exposed, since it gives out, for example, onto a second lateral surface PW2. Once again with reference to FIG. 5, it should be noted that, without this implying any loss of generality, it refers to an embodiment in which the support 4 has a shape different from a parallelepiped, since it includes a main body having a parallelepipedal shape and a plurality of protrusions, which branch off from one and the same lateral face of the main body, until they give out onto the aforementioned lateral surface PW2.

The package 1 further comprises a source lead 31, which, as described in greater detail hereinafter, is shared between the first and second portions P1, P2 of the package 1. Also the current lead 31 is exposed laterally and underneath.

The package 1 of the power semiconductor device 2 further comprises (see once again FIGS. 1 and 2) a further insulation multilayer 16, referred to in what follows as "top insulation multilayer 16".

In detail, the top insulation multilayer 16 is a DBC multilayer and includes a respective top metal layer 16a and a respective bottom metal layer 16b, both made of copper, as well as a respective intermediate insulating layer 16c made of ceramic material, for example, the same material as the one of which the intermediate insulating layer 26c is made. The thicknesses of the top metal layer 16a and of the intermediate insulating layer 16c may be equal, for example, to the thicknesses of the corresponding layers of the bottom insulation multilayer 26. The intermediate insulating layer 16c electrically insulates the top and bottom metal layers 16a, 16b.

The top metal layer 16a of the top insulation multilayer 16 forms a part of the top surface 1a of the package 1, which can function itself as heat dissipater or be coupled (in a way not illustrated herein) to a further external heat dissipater so as to increase the capacity of heat dissipation outwards.

The bottom metal layer 16b of the top insulation multilayer 16 is shaped in a way corresponding to the conformation of the first and second dice 6, 106. In particular, the bottom metal layer 16b comprises a first peripheral portion 30 and a second peripheral portion 130, and a central portion 32.

The first and second peripheral portions 30, 130 are the same as one another and couple, respectively, to the first and second dice 6, 106, in the same way. In other words, the relative arrangement of the first peripheral portion 30 and the first die 6 is the same as the relative arrangement of the second peripheral portion 130 and the second die 106. For this reason, described in what follows are only the first peripheral portion 30 and corresponding coupling thereof to the first die 6. Moreover, the elements of the second peripheral portion 130 are designated by the same reference numbers as the ones used for the first peripheral portion 30, increased by 100.

In detail, the first peripheral portion 30 of the bottom metal layer 16b has a shape that corresponds to the arrangement of the gate-metallization lines 10 of the first die 6, and more precisely to the arrangement of the corresponding main passivation portions 10', as well as to the arrangement of the source contact regions 12.

In greater detail, and with reference to FIG. 2, the first peripheral portion 30 of the bottom metal layer 16b of the top insulation multilayer 16 has a comb-like conformation. In fact, the first peripheral portion 30 includes a planar region 34 and a number of contact regions 36, which extend as bumps, starting from the planar region 34, towards the underlying first die 6. In particular, each contact region 36 extends until it penetrates into a corresponding window 18 of the underlying first die 6, so as to couple mechanically and electrically to a corresponding source contact region 12.

For instance, each contact region 36 has a parallelepipedal shape and has a respective bottom plane surface, which mechanically and electrically couples to the corresponding source contact region 12, by interposition of a corresponding solder-paste region 19. Moreover, each contact region 36 extends at a distance from the side walls of the corresponding window 18, so as not to contact the corresponding main passivation area 11.

In turn, adjacent pairs of contact regions 36 laterally delimit a corresponding insulation cavity 40, which is delimited at the top by a corresponding part of the planar region 34 and is open at the bottom. The insulation cavities 40 are hence trenches (for example, with rectangular cross section, invariant for translations parallel to the direction of extension of the gate-metallization lines 10) interposed between the contact regions 36, so as to overlie, at a distance, corresponding gate-metallization lines 10. The top wall of each trench is formed by the planar region 34, whereas the side walls are formed by the corresponding contact regions 36. Present in FIG. 2 is just one insulation cavity 40, because it is assumed, purely by way of example, that the first die 6 comprises just two source contact regions 12 and just one gate-metallization line 10. However, it is evident how the number, shape, and arrangement of the insulation cavities 40 may differ, according to the arrangement and conformation of the gate-metallization lines 10 and of the source contact regions 12.

In practice, the insulation cavities 40 are laterally staggered with respect to the windows 18, with respect to which they are moreover arranged at a greater height. In addition, the insulation cavities 40 and the windows 18 have opposite concavities; i.e., the insulation cavities 40 are open downwards, whereas the windows 18 are open upwards.

In greater detail, each insulation cavity 40 overlies a corresponding main passivation portion 10', which, as has been said, in turn overlies a corresponding gate-metallization line 10 and projects from the adjacent windows 18, towards the respective insulation cavity 40. Without this implying any loss of generality, the projection of each main passivation portion 10' is such that the point of maximum height is to a first approximation arranged above the underlying gate-metallization line 10.

In particular, each main passivation portion 10' is set at a distance from the respective insulation cavity 40; i.e., it does not contact either the top wall or the side walls of the corresponding insulation cavity 40, even though it can penetrate at least in part into the corresponding insulation cavity 40, and more precisely into the volume delimited by the latter; in other words, present between each main passivation portion 10' and the corresponding insulation cavity 40 is a gap that prevents contact between the main passivation portion 10' and the side and top walls of the insulation cavity 40. In this way, the contact regions 36 straddle or by-pass the main passivation portions 10', since they are laterally interspersed with the latter. Thus the contact regions 36, which enable contacting of the source contact regions 12, are prevented from damaging the main passivation portions 10' and the underlying gate-metallization lines 10.

As regards the central portion 32 of the bottom metal layer 16b of the top insulation multilayer 16, it connects the planar regions 34, 134 of the first and second peripheral portions 30, 130 of the bottom metal layer 16b, to form a single piece with the latter. The planar regions 34, 134 and a top portion of the central portion 32 form a layered region that may have a thickness, for example, equal to the thickness of the bottom metal layer 26b of the bottom insulation multilayer 26.

As may be seen in FIG. 1, a bottom portion of the central portion 32 of the bottom metal layer 16b moreover forms a main portion 14' of a source clip 14. This source clip 14 further comprises a connecting portion 14", which connects the aforesaid main portion 14' to the source lead 31. This connecting portion 14" may be provided integrally with the main portion 14', and hence with the central portion 32 of the bottom metal layer 16b. Variants are in any case possible, in which, for example, the source clip 14 does not form a single piece with the bottom metal layer 16b, but is coupled to the latter by interposition of a corresponding area of solder paste.

In practice, the bottom metal layer 16b of the top insulation multilayer 16 shorts the source terminals of the first and second power MOSFETs M1, M2, thus forming a node electrically accessible via the source lead 31. The drain and gate terminals of the first power MOSFET M1 are, instead, accessible via the drain lead 27 and the gate lead 29, respectively; the drain and gate terminals of the second power MOSFET M2 are instead accessible via the drain lead 127 and the gate lead 129, respectively.

The advantages of the solution disclosed emerge in clearly from what has been described above.

In particular, in terms of encumbrance, the present power device makes it possible to benefit from the advantages deriving from a package of the surface mount type, albeit guaranteeing good electrical insulation and a considerable heat-dissipation capacity.

In particular, the present package may have a maximum thickness in a vertical direction in the region of 2-3 mm. Moreover, the package affords the possibility of cooling on both sides (both top and bottom). Once again, the presence of the top insulation multilayer in bridge configuration, i.e., which extends so as to overlie both of the dice, guarantees a considerable thermal efficiency, reduced parasitic packaging electrical effects (in particular, inductive effects) and a low contact resistance. Once again, the connections to the source regions of the power MOSFETs do not require the use of wire bonding.

In particular, as regards thermal dissipation, the fact that the top metal layer 16a is insulated from the source regions of the first and second power MOSFETs M1 and M2 means that it can be sized freely so as to optimize the power dissipation, without constraints due to the need to guarantee a certain flow of current. In this connection, the thickness of the bottom metal layer 16b can be sized so that the flow of current is limited not by this, but rather by the drain clips 28 and 128.

In addition, with reference, for example, to the first portion P1 of the package 1, the presence of the top metal layer 26a of the bottom insulation multilayer 26 makes it possible to have an optimal coupling area for the drain clip 28. Moreover, the fact that the leadframe supports are insulated from the drain regions of the first and second power MOSFETs M1 and M2 means that they are at one and the same potential. Consequently, the leadframe supports can be arranged very close to one another, with consequent reduction of the vertical encumbrance of the package 1.

Finally, it is clear that modifications and variations may be made to what has been described and illustrated herein, without thereby departing from the sphere of protection of the present disclosure, as defined in the annexed claims.

The metal layers of the insulation multilayer may be made of metal materials other than copper.

The clip connections may be replaced by corresponding wire bonds, even though the clips guarantee a greater drawing-off of heat and the capacity of being traversed by higher currents.

The shape of the support of the leadframe may be different from what has been described; for example, it may include a pair of planar subregions connected together and vertically staggered with respect to one another.

The gate, source, and drain leads, as well as the portions of the support that gives out on the outside of the package may protrude with respect to the envelope of the package, instead of being flush with the respective walls of the package.

As regards each of the first and second peripheral portions of the bottom metal layer of the top insulation multilayer, the corresponding contact regions may be distributed in a way different from what has been described. In addition, each one of the aforementioned first and second peripheral portions may include a respective planar subportion, without contact regions.

Figure 6:
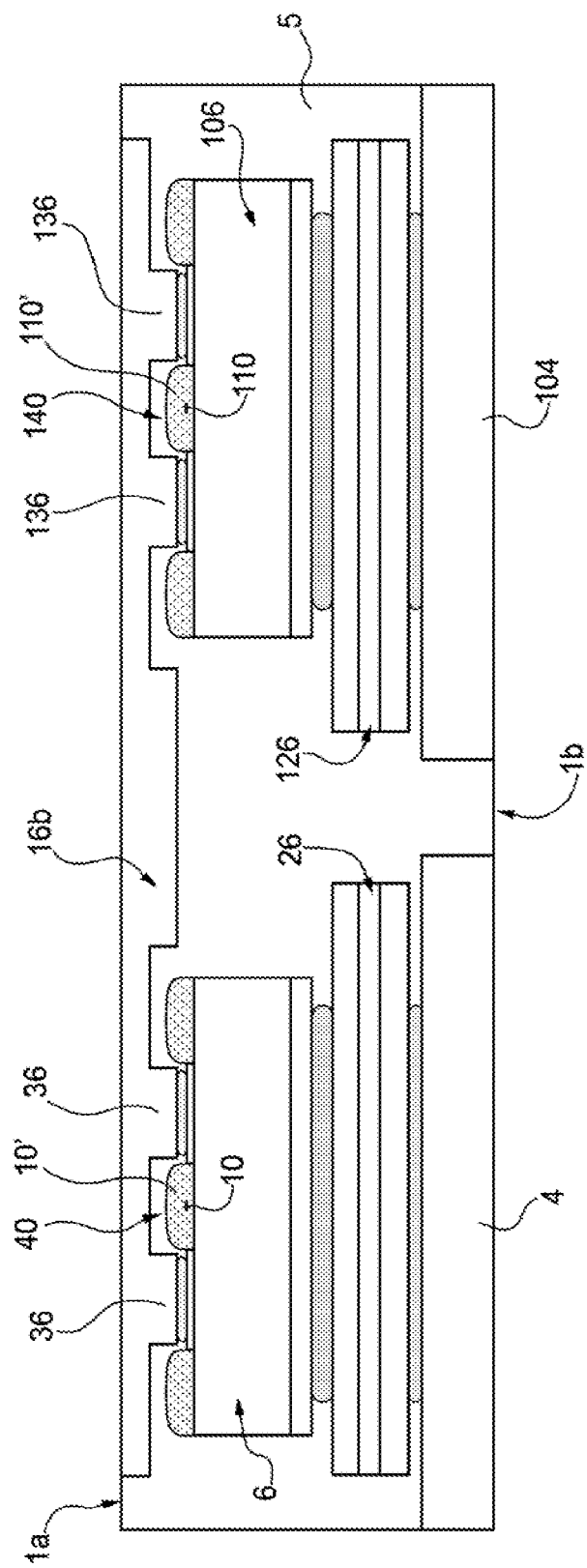
FIG. 6 is a schematic cross-sectional view of a further embodiment of the present device.

Moreover possible are embodiments of the type illustrated in FIG. 6, in which the top metal layer 16a and the intermediate layer 16c of the top insulation multilayer 16 are absent. In this case, the bottom metal layer 16b forms part of the top surface 1a of the package 1.

Finally, corresponding semiconductor devices other than MOSFETs, such as, purely by way of example, IGBTs, may be integrated in the dice. The present package makes it, in fact, possible to manage the coupling between the top insulation multilayer and any semiconductor device, present in which are passivation regions overlying metallization lines arranged on the semiconductor body of the corresponding die and interposed between contact regions that are to be biased.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a first conductive layer having:
a plurality of protrusions; and
a plurality of recesses positioned between adjacent ones of the plurality of protrusions;
a first die having:
a first contact pad aligned with a first one of the plurality of protrusions; and
a first plurality of dielectric projecting regions adjacent to the first contact pad, each of the first dielectric projecting regions extending into respective ones of the plurality of recesses, being spaced apart from the first conductive layer, extending towards the first conductive layer, and having a respective end that is present within a respective recess of the plurality of recesses that faces towards the first conductive layer;
a second die having:
a second contact pad aligned with a second one of the plurality of protrusions; and
a second plurality of dielectric projecting regions adjacent to the second contact pad, each of the second dielectric projecting regions extending into respective ones of the plurality of recesses, being spaced apart from the first conductive layer, extending towards the first conductive layer, and having a respective end that is present within a respective recess of the plurality of recesses that faces towards the first conductive layer.

2. The device of claim 1, further comprising a second conductive layer coupled to a surface of the first conductive layer facing towards the first die and the second die, the surface of the first conductive layer between the first one of the plurality of protrusion and the second one of the plurality of protrusion.

3. The device of claim 2, wherein the second conductive layer is coupled to a first lead.

4. The device of claim 3, further comprising:
a first multilayer structure coupled to the first die; and
a second multilayer structure coupled to the second die, the second multilayer structure being spaced from the first multilayer structure.

5. The device of claim 4, further comprising:
a second lead;
a first electrical connection having a first end coupled to the first multilayer structure and a second end coupled to the second lead;
a third lead; and
a second electrical connection having a first end coupled to the second multilayer structure and a second end coupled to the third lead.

6. The device of claim 5, wherein the second conductive layer has a first dimension extending from a first end to a second end of the second conductive layer, the first electrical connection has a second dimension extending from a first end to a second end of the first electrical connection, the first dimension being greater than the second dimension.

7. The device of claim 6, wherein the second electrical connection has a third dimension extending from a first end to a second end of the second electrical connection, the third dimension being less than the first dimension.

8. The device of claim 5, further comprising:
a fourth lead;
a first wire having a first end coupled to the first die and a second end coupled to the fourth lead;
a fifth lead; and
a second wire having a first end coupled to the second die and a second end coupled to the fifth lead.

9. The device of claim 2, wherein the second conductive layer extends outward past sidewalls of the first conductive layer, extends outward past sidewalls of the first die, and extends outward past sidewalls of the second die.

10. A device, comprising:
a power semiconductor package that includes:
a first lead;
a first die;
a second die;
a first conductive layer coupled to the first die and the second die, the first conductive layer including:
a plurality of protrusions including a first group and a second group, the first group coupled to the first die and the second group coupled to the second die; and
a plurality of recesses positioned between adjacent ones of the plurality of protrusions;
a second conductive layer coupled to the first conductive layer, the second conductive layer being positioned between the first and second die, the second conductive layer being between the first group and the second group of the plurality of protrusions of the first conductive layer, and the second conductive layer extending from the first conductive layer to the first lead.

11. The device of claim 10, wherein the power semiconductor package further comprising:
a second lead;
a third lead;
a first wire coupled to the first die and the second lead;
a second wire coupled to the second die and the third lead, the second wire being spaced from the first wire by the second conductive layer.

12. The device of claim 10, wherein the power semiconductor package further comprising:
a first multilayer structure coupled to the first die; and
a second multilayer structure coupled to the second die, the second multilayer structure laterally spaced from the first multilayer structure.

13. The device of claim 12, wherein the power semiconductor package further comprising:
a second lead;
a third lead;
a third conductive layer coupled to the first multilayer structure and the second lead; and
a fourth conductive layer coupled to the second multilayer structure and the third lead.

14. The device of claim 13, wherein the second conductive layer is between the third conductive layer and the fourth conductive layer.

15. A device, comprising:
a first multilayer structure;
a first die coupled to the first multilayer structure, the first die including:
a first surface and a second surface opposite to the first surface, the first surface facing towards the first multilayer structure and the second surface facing away from the first multilayer structure;
a first plurality of dielectric projecting regions protruding at the second surface of the first die, each one of the first plurality of dielectric projecting regions including a respective end;
a first contact region at the second surface, the first contact region positioned between a first one and a second one of the first plurality of dielectric projecting regions; and
a second contact region at the second surface, the second contact region positioned between the second one and a third one of the first plurality of dielectric regions;
a first conductive layer coupled to the first die, the first conductive layer is spaced apart from the first plurality of dielectric projecting regions, the first conductive layer including:
a surface facing towards the first die and the first plurality of dielectric projecting regions, the surface spaced apart from the respective ends of the first plurality of dielectric projecting regions;
a first protrusion between the first one and the second one of the first plurality of dielectric projecting regions, the first protrusion being coupled to the first contact region; and
a second protrusion between the first one and the third one of the first plurality of dielectric projection regions, the second protrusion being coupled to the second contact region; and
a recess between the first protrusion and the second protrusion, the recess receives the first one of the first plurality of dielectric projecting regions;
a second conductive layer coupled to the first conductive layer, the second conductive layer extending from the first conductive layer.

16. The device of claim 15, further comprising:
a second multilayer structure laterally spaced from the first multilayer structure;
a second die coupled to the second multilayer structure, the second die including:
a second plurality of dielectric projecting regions;
a third contact region between a first one and a second one of the second plurality of dielectric regions; and
a fourth contact region between the first one and a third one of the second plurality of dielectric regions.

17. The device of claim 16, wherein the first conductive layer further comprising:
a third protrusion between the first one and the second one of the second plurality of dielectric projecting regions, the third protrusion being coupled to the third contact region; and
a fourth protrusion between the second one and the third one of the second plurality of dielectric projecting regions, the fourth protrusion being coupled to the fourth contact region.

18. The device of claim 16, wherein the second conductive layer extends between the first die and the second die.

19. The device of claim 15, further comprising a resin that covers sidewalls of the first die, covers sidewalls of the first multilayer structure, and covers sidewalls of the first conductive layer.

20. The device of claim 15, further comprising:
an insulating layer on the first conductive layer; and
a second conductive layer on the insulating layer, the second conductive layer spaced from the first conductive layer by the insulating layer.

* * * * *